(12) United States Patent
Hasegawa et al.

(10) Patent No.: US 6,909,646 B2
(45) Date of Patent: Jun. 21, 2005

(54) SEMICONDUCTOR MEMORY DEVICE HAVING IMPROVED ARRANGEMENT FOR REPLACING FAILED BIT LINES

(75) Inventors: Masatoshi Hasegawa, Ome (JP); Kazuhiko Kajigaya, Iruma (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/627,769

(22) Filed: Jul. 28, 2003

(65) Prior Publication Data

US 2004/0017705 A1 Jan. 29, 2004

Related U.S. Application Data

(63) Continuation of application No. 09/811,400, filed on Mar. 20, 2001, now Pat. No. 6,603,688.

(30) Foreign Application Priority Data

Mar. 29, 2000 (JP) ........................................ 2000-090171

(51) Int. Cl.[7] .............................................. G11C 7/00
(52) U.S. Cl. ............. 365/200; 365/230.03; 365/189.07; 365/225.7
(58) Field of Search ............................ 365/200, 230.03, 365/189.07, 225.7

(56) References Cited

U.S. PATENT DOCUMENTS

| | | | |
|---|---|---|---|
| 4,661,929 A | | 4/1987 | Aoki et al. |
| 5,481,708 A | | 1/1996 | Kukol |
| 5,652,687 A | | 7/1997 | Chen et al. |
| 5,808,944 A | * | 9/1998 | Yoshitake et al. .......... 365/200 |
| 5,818,792 A | | 10/1998 | Sasaki et al. |
| 5,970,003 A | | 10/1999 | Miyatake et al. |
| 6,104,647 A | | 8/2000 | Horiguchi et al. |
| 6,233,181 B1 | * | 5/2001 | Hidaka ....................... 365/200 |
| 6,256,237 B1 | | 7/2001 | Ho et al. |
| 6,317,355 B1 | | 11/2001 | Kang |
| 6,373,776 B2 | | 4/2002 | Fujisawa et al. |

FOREIGN PATENT DOCUMENTS

| | | |
|---|---|---|
| JP | 58 60489 | 4/1983 |
| JP | 59178698 | 10/1984 |
| JP | 60 151699 | 8/1985 |
| JP | 60 151895 | 8/1985 |
| JP | 60 151896 | 8/1985 |
| JP | 61 20300 | 1/1986 |
| JP | 61 77946 | 6/1994 |
| JP | 7-29632 | 11/1995 |
| JP | 11 219597 | 10/1999 |

OTHER PUBLICATIONS

Micropatent PatSearch—Abstract of JP 07–296328.
S. Narumi et al., "Simulation of the write filed for T–shaped pole heads", Journal of Applied Physics, vol. 87, No. 9, Parts 2 and 3, May 1, 2000.

* cited by examiner

Primary Examiner—Connie C. Yoha
(74) Attorney, Agent, or Firm—Antonelli, Terry, Stout & Kraus, LLP

(57) ABSTRACT

In a bit-line direction, a plurality of memory mats are arranged including a plurality of memory cells respectively coupled to bit lines and word lines, and a sense amplifier array is arranged including a plurality of latch circuits having input/output nodes connected to a half of bit-line pairs separately provided to the memory mats in a region between the memory mats placed in the bit-line direction, thereby making possible to replace with a redundant bit line pair and the corresponding redundant sense amplifier on a basis of each bit-line pair and sense amplifier connected thereto, thereby realizing effective and rational Y-system relief.

11 Claims, 11 Drawing Sheets

WHEN FAILED BIT LINE ON MAT 0 OR 1 ···· BLOCK 1 RELIEVED
WHEN FAILED BIT LINE ON MAT 2 ··········· BLOCK 2 RELIEVED
WHEN FAILED BIT LINE ON MAT 3 ··········· BLOCK 3 RELIEVED
WHEN FAILED BIT LINE ON MAT 4 ··········· BLOCK 4 RELIEVED
WHEN FAILED BIT LINE ON MAT 5 ··········· BLOCK 5 RELIEVED
WHEN FAILED BIT LINE ON MAT 6 OR 7 ···· BLOCK 6 RELIEVED

SEMICONDUCTOR MEMORY DEVICE HAVING IMPROVED ARRANGEMENT FOR REPLACING FAILED BIT LINES

CROSS-REFERENCE TO RELATED APPLICATIONS

This application is a Continuation application of application Ser. No. 09/811,400, filed Mar. 20, 2001, now U.S. Pat. No. 6,603,688 the entire disclosure of which is hereby incorporated by reference.

BACKGROUND OF THE INVENTION

This invention relates to semiconductor memory devices and, more particularly, to a technology effective in utilizing for a Y-system-relief technology on a dynamic RAM (Random Access Memory) of so-called a one-cross-point scheme having dynamic memory cells arranged at cross points between the word lines and the bit lines.

In the research done after completing the present invention, there have been revealed Japanese Patent Laid-open No. 178698/1984 (hereinafter, referred to as Prior Art 1) and Japanese Patent Laid-open No. 20300/1986 (hereinafter, referred to as Prior Art 2) as the dynamic-RAM redundant relief technologies of the open-bit-line type (one-cross-point scheme), hereinafter explained, considered related to the present invention. The publication of Prior Art 1 discloses a 64K-bit dynamic RAM provided with spare arrays. The publication of Prior Art 2 discloses a one-cross-point dynamic type memory provided with a redundant relief circuit. However, there found no conception that a plurality of memory mats are provided in a direction of the bit line to effectively relieve a failed bit line on a mat-by-mat basis as disclosed in the dynamic RAM according to the present invention, hereinafter referred.

Various methods for memory relief are disclosed in the following references, Japanese Patent Laid-Open Nos. 151895/1985, 1511896/1985, 60489/1983, 77946/1986, 151899/1986 and 219597/1999.

SUMMARY OF THE INVENTION

The present inventor has noted on the fact that bit-line failures includes the case the failure is on the memory cell itself and the case the failure is on the bit line, and conceived for improving the efficiency of using the redundant bit lines and positively relieving from bit-line failure where memory mats in plurality are provided in the bit-line direction.

It is an object of this invention to provide a semiconductor memory device that realizes effective, rational Y-system relief. Another object of the invention is to provide a semiconductor memory device that is simple in structure but realizes effective Y-system relief. The above and other objects and novel features of the invention will be made apparent from the description of the specification and the accompanying drawings.

The outline of the representative of the inventions as disclosed in the present specification, if briefly explained, is as follows. In a bit-line direction, a plurality of memory mats are arranged including a plurality of memory cells respectively coupled to bit lines and word lines, and further a sense amplifier array is arranged including a plurality of latch circuits having input/output nodes connected to a half of bit-line pairs separately provided to the memory mats in a region between the memory mats placed in the bit-line direction, thereby making possible to replace with a redundant bit-line pair and the corresponding redundant sense amplifier on a basis of each bit-line pair and the sense amplifier connected thereto.

DETAILED DESCRIPTION OF THE INVENTION

Figure 9:
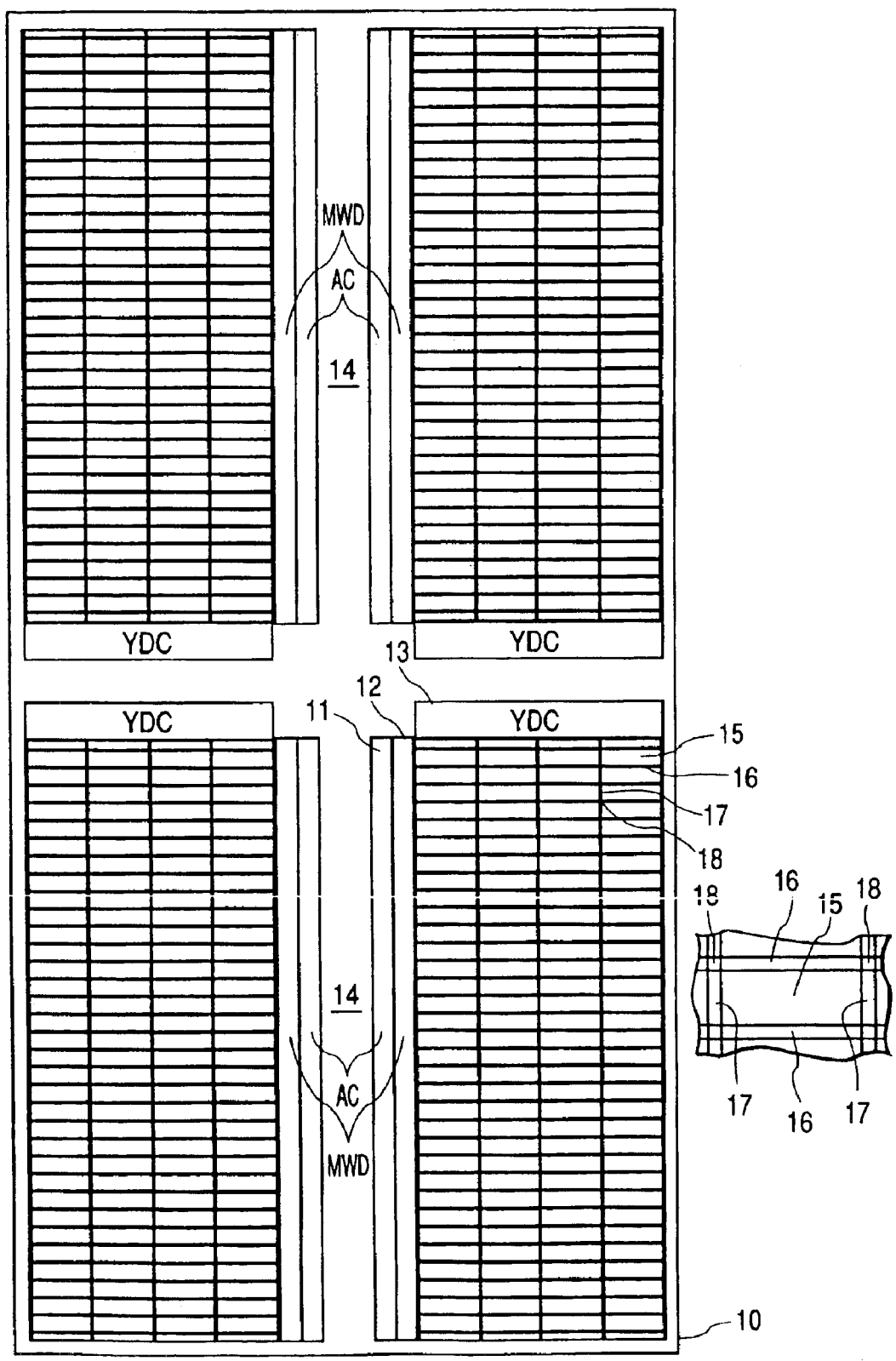
FIG. 9 is a schematic layout view showing an embodiment of a DRAM to which the invention is applied.

FIG. 9 shows a schematic layout as one embodiment of a DRAM to which this invention is applied. In the figure, the circuit blocks constituting the DRAM to which the invention is applied are shown for understanding the major portion thereof, which are formed on one semiconductor substrate of silicon or the like by a known semiconductor IC manufacture technique.

In this embodiment, although not limited, memory arrays are roughly divided into four. The division is to the left and right with respect to a lengthwise direction of the semiconductor chip, providing, in a central area 14, an address input/output circuit, a data input/output circuit and an input/output interface circuit made by bonding pad arrays and a power circuit including booster and step-down circuits and so on. In the areas of the central area 14 adjacent the opposite memory arrays, there are arranged a memory array control circuit (AC) 11 and a main word driver (MWD) 12. The memory array control circuit 11 is configured with a control circuit for driving a sub-word select line or sense amplifier and a main amplifier. In each of the four memory arrays divided two in the left and right and two in the up and down, a column decoder region (YDC) 13 is provided vertically centrally with respect to a lengthwise direction of the semiconductor chip.

In each of the memory arrays, the main word driver 12 forms a select signal on a main word line extending to penetrate the corresponding one memory array. In the main word driver region 12, a sub-word-select line driver is arranged for sub-word selection and extended parallel with the main word line to form a select signal on the sub-word select line. The column decoder 13 forms a select signal on a column select line extending penetrating the corresponding one memory array.

Each memory array is divided into a plurality of memory cell arrays (hereinafter, referred to as memory mats) 15. The memory mat 15 is formed encompassed by the sense amplifier regions 16 and the sub-word driver regions 17, as shown in its magnifying figure. The sense amplifier region 16 and the sub-word driver region 17 have an intersection providing an intersection region (cross area) 18. A sense amplifier provided in the sense amplifier region 16 is configured by a latch circuit of a CMOS structure. Thus, a one-cross-point scheme or open bit line type is provided, in order to amplify signals on a complementary bit line extending left and right about the sense amplifier as the center. The arrangement is alternate with respect to the arrangement of bit lines. This divides the bit lines provided on the memory mats into a half and alternately distributes them to the sandwiching two sense amplifiers.

The one memory mat 15 as shown in the magnifying view, although not especially limited, has sub-word lines (word lines) in the number of 512 and ones of the orthogonal complementary bit lines (data lines) in the number of 1024. In the one memory array, the memory mats 15 are provided in the number of 32 for normal in a bit-line extension direction and 2 for redundancy. Two redundant memory mats are used also for reference because the end memory mats, although not especially limited in number, are given a half the number of memory cells. In this case, one memory mat is assigned for redundancy.

Because the memory mat 15 has a pair of complementary bit lines with respect to the sense amplifier 16 as a center, the bit line is substantially divided into sixteen by the memory mats 15 as viewed in an extension direction of the bit line. Also, the memory mats 15 are arranged four in an extension direction of the word line. Due to this, the sub-word line is divided into four by the memory mats 15 as viewed in the word-line extension direction.

Although not especially limited, because one memory mat 15 has bit lines in the number of 1024 except for the end memory mat, it is connected with memory cells corresponding to nearly 4K in the word-line direction. Because the sub-word line is provided 512 in the number, memory cells corresponding to 512×32=16K are connected in the bit-line direction. This provides one memory array with a memory capacity of nearly 4K×16K=64 M bits. Owing to the four memory arrays, the memory chip 10 is totally given with a memory capacity of nearly 4×64 M=256 M bits.

In the description, the term "MOS" in nature is understood to refer, for simplicity, to the metal-oxide semiconductor structure. However, the recent appellation of MOS in a general sense includes those that the metal in a substantial portion of a semiconductor device is changed to a non-metallic, electric conductor such as polysilicon or those that oxide is changed to other insulators. It has being understood that CMOS involves a broad technical meaning met with the change in the way of grasping MOS as in the foregoing. Similarly, MOSFET has being meant not to be understood in a narrow sense but to cover such a broad-sense structure that can be substantially grasped as an insulated-gate field effect transistor. The CMOS, MOSFET, etc. in the present invention are in conformity to the generalized appellation as the foregoing.

Figure 10A:
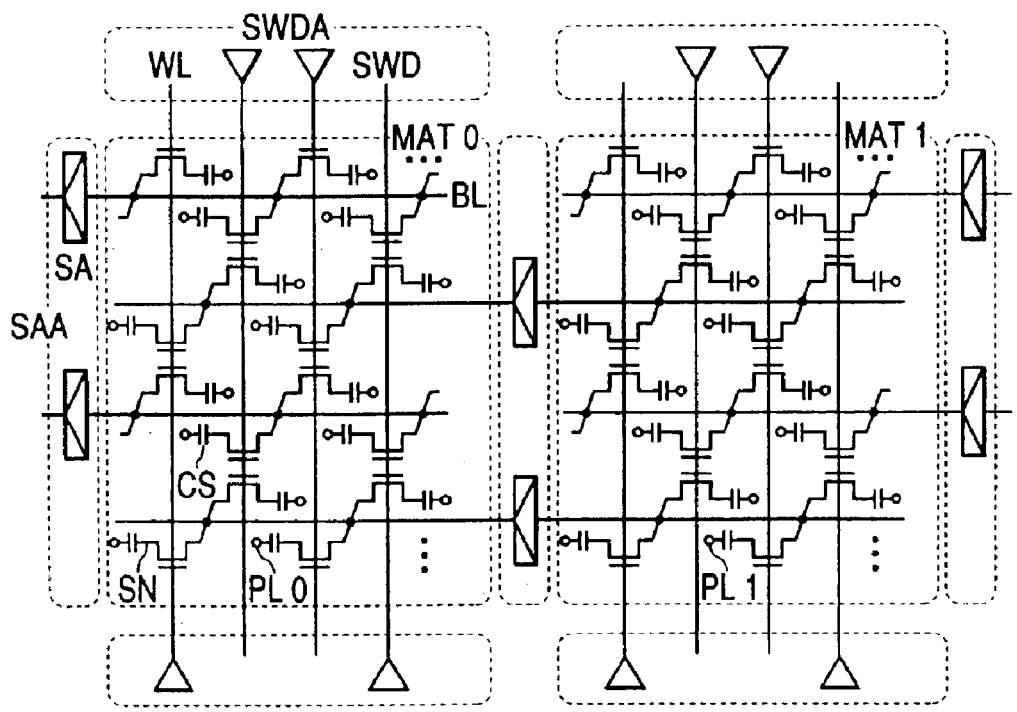
FIGS. 10A and 10B are configuration diagrams showing an embodiment for explaining memory mats of a DRAM to which the invention is applied.
Figure 10B:
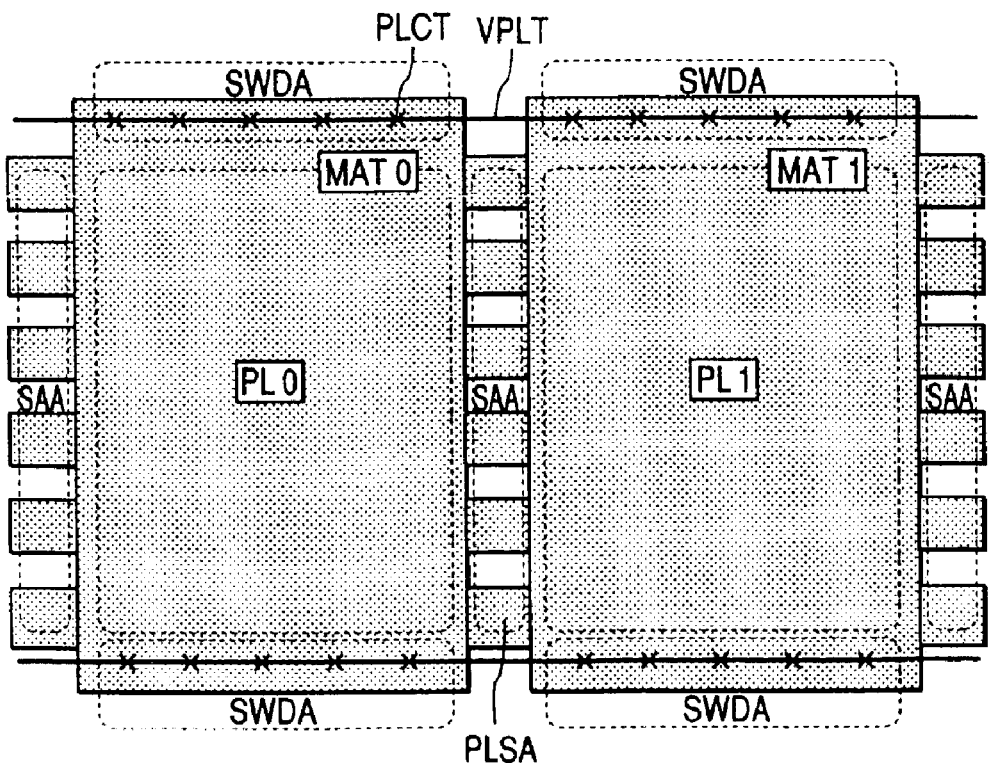

FIGS. 10A and 10B show configurations of one embodiment for explaining the memory mats in the DRAM to which the invention is applied. FIG. 10A shows a circuit corresponding to two memory mats MAT0, MAT1 provided on the DRAM in a hierarchical word-line scheme as in FIG. 9, while FIG. 10B shows a layout corresponding thereto. In FIG. 10A, memory cells MC each formed by a MOSFET and cell capacitance CS are connected at all the intersections between the bit lines BL and the sub-word lines WL. The bit line BL is connected with a sense amplifier SA while the word line WL with a sub-word driver SWD.

In this embodiment, in order to decrease the number of main word lines, in other words, moderate the interconnect pitch of main word lines, four sub-word lines, although not especially limited, are arranged in the complementary-bit-line direction for one main word line, as hereinafter described. A sub-word select driver is arranged in order to select one sub-word line from among the sub-word lines divided into two in the main-word-line direction as in FIG. 9 and each assigned four in the complementary-bit-line direction. This sub-word select driver forms a select signal to select one of the four sub-word select lines extending in a direction of arranging the sub-word drivers (sub-word driver array SWDA). The main word line MWL, although not shown, is extended parallel with the sub-word line WL. The column select line YS, although not shown, is arranged parallel with the extension direction of the bit line BL, in order to orthogonally intersect with that.

The sense amplifiers SA in the sense amplifier array SAA provided between the two memory mats MAT0 and MAT1 are connected to complimentary bit lines as extended on the both sides of the two memory mats MAT0 and MAT1. These sense amplifiers SA in the sense amplifier array SAA, although not limited, have one sense amplifier SA arranged per two bit lines. Consequently, where the sense amplifier array SAA provided between the memory mats MAT0 and MAT1 has bit lines BL in the number of 1024 as the foregoing, a half thereof, or 512, sense amplifiers SA are provided.

In the memory mat MAT0, the remaining 512 bit lines are connected to the sense amplifiers SA provided in the sense amplifier array SAA on an opposite side to the memory mat MAT1. In the memory mat MAT1, the remaining 512 bit lines are connected to the sense amplifiers SA provided in the sense amplifier array SAA provided on the opposite side to the memory mat MAT0. Because the sense amplifiers are each to be formed per two bit lines alternately separately on opposite sides thereof due to the separate arrangement of sense amplifiers SA on the opposite sides in the bit-line direction, it is possible to densely form memory mats and sense amplifier arrays with aligning the pitches of the sense amplifiers SA and the bit lines BL.

This is true for the sub-word drivers SWD. The sub-word lines WL in the number of 512 provided for the memory mat MAT0 are connected, by grouping into 256 lines, to 256 sub-word drivers SWD of the sub-word driver array SWDA arranged on each side of the memory mat MAT0. In this embodiment, the sub-word drivers SWD are separately arranged two for each with two sub-word lines WL taken as one pair. That is, by taking the sub-word lines corresponding to two memory cells having a common connection to the bit line as one pair, two sub-word drivers are arranged on one side (upper side in the figure) of the memory mat MAT0. By taking the adjacent two sub-word lines like the above as one pair, two sub-word drivers are arranged on the other side (lower side in the figure) of the memory mat MAT0.

The sub-word drivers SWD, although not shown, form a select signal on a sub-word line of the memory mats provided on opposite sides sandwiching the sub-word driver array SWDA forming the same. This makes it possible to separately arrange the sub-word drivers SWD with efficiency corresponding to the sub-word lines formed matched to the arrangement pitch of the memory cells and operate to select a sub-word line WL at high speed.

Memory cells MC are formed at cross-points of the bit lines BL and the sub-word lines WL for the memory cell arrays (or memory mats) MAT0, MAT1 surrounded by the forgoing sub-word driver arrays SWDA and sense amplifier arrays SAA. In the memory mat MAT0 forming the memory cells MC, as shown in FIG. 10B an upper electrode (plate electrode) PL for a storage capacitor CS is formed in a planar electrode common to all the memory cells MC in the memory mat MAT0, MAT1. The feed of power to the plate electrode PL is made from a power interconnection VPLT laid in an extension direction of the bit line BL to the boundary of the sub-word driver array SWDA and the memory mat MAT0, MAT1 through a connection PLCT. In the figure, a storage node SN is a lower electrode for the storage capacitor CS and shown as a connection to an address select MOSFET.

In this embodiment, as in FIG. 10B the plate electrodes PL0 and PL1 respectively formed on the memory mats MAT0 and MAT1 existing on the both sides of the sense amplifier array SAA are connected with each other by interconnections PLSA using a plate layer itself. Moreover, the interconnections PLSA are provided in multiplicity in a manner penetrating the sense amplifier array SAA to greatly reduce the resistance of between the two plate electrodes PL0 and PL1. Due to this, when amplifying by the sense amplifier SA a weak signal read from a memory cell MC selected onto complementary bit lines BL of the memory mats MAT0 and MAT 1, opposite phases of noise occurring on the plate electrodes PL0 and PL1 can be canceled at high speed. Thus, the noise caused on the plate electrodes PL0 and PL1 can be greatly decreased.

Figure 11A:
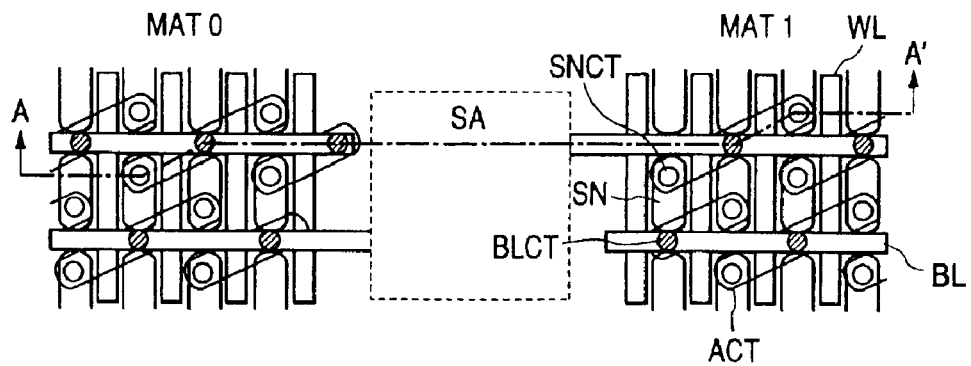
FIGS. 11A and 11B are explanatory figures showing an embodiment of a memory cell array in a DRAM to which the invention is applied.
Figure 11B:
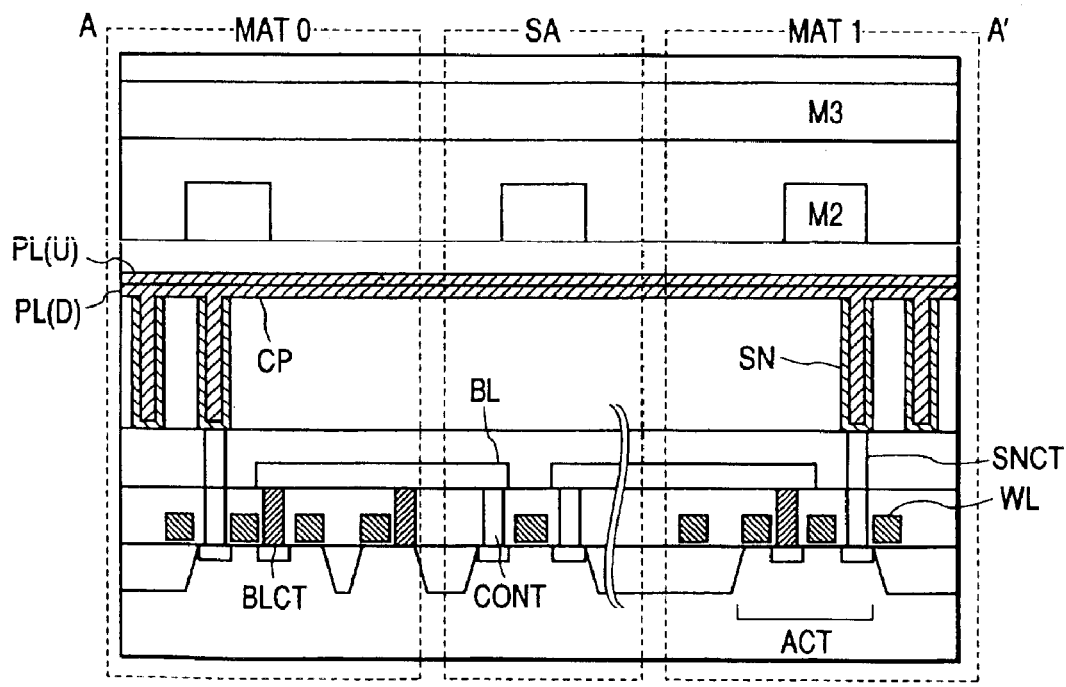

FIGS. 11A and 11B show explanatory views of one embodiment of a memory cell array in a DRAM to which the invention is applied. FIG. 11A shows a layout of a memory cell array having two memory mats of MAT0 and MAT1, while FIG. 11B shows a device sectional structure of a part A–A' in FIG. 11A. In the same figure, omitted are a layout and section of a sense amplifier SA region provided between MAT0 and MAT1.

ACT is an active region of a MOSFET. SNCT is a contact (connection point) connecting between a storage node SN for the memory cell and a source/drain diffusion layer corresponding to the storage node SN of the MOSFET formed in the active region ACT. BLCT is a contact (connection point) connecting between a bit line BL and a source/drain diffusion layer corresponding to an input/output terminal of the memory cell corresponding to the bit line BL of a MOSFET formed in the active region ACT. CP shows a capacitance dielectric film of a storage capacitor. Herein, the first-level metal layer M1 and the bit line BL are in a common interconnect layer, and the first-level polysilicon layer FG and the sub-word line WL are also structured by a common interconnect layer.

By connecting the memory mat plate electrodes PL for memory mats for MAT0 and MAT11 on the both sides of SA by an electrode itself structuring a plate electrode PL itself without disconnection over the sense amplifier SA as shown in FIG. 11B, it is possible to greatly reduce the resistance between the plate electrode PL of the memory mat MAT0 and the plate electrode PL of the memory mat MAT1. The memory cell uses a COB (Capacitor over Bitline) structure. That is, a storage node SN is provided on the bit line BL. This makes it possible to form a plate electrode PL in one single planar form without disconnection due to the connection portion BLCT to the bit line BL and address select MOSFET in the memory mat MAT. Thus, the resistance of the plate electrode PL can be decreased.

In this embodiment, the plate electrode PL is made in a stack structure as with PL(D) and PL(U), as shown in FIG. 11B. This can favorably reduce the sheet resistance value of the plate electrode PL. In the case, as one example, where a high dielectric film such as BST or $Ta_2O_5$ is used for the capacitance insulation film CP of the storage-capacitance, if Ru is used in lower-electrode (storage node) SN and upper-electrode lower-level PL(D), then the storage capacitor CS can be increased in capacitance. Ru can reduce the resistace value of the plate electrode PL because of its lower sheet resistance as compared to poly-Si conventionally used.

If W is layered to the above-structured plate electrode PL(U), the resistance value of the plate electrode PL can be further decreased. If the resistance value of the plate electrode PL itself is decreased in this manner, the noise on the plate electrode PL is canceled at increased speed thereby reducing plate electrode PL noise. Also, the plate electrode PL(D) may use TiN. This also provides the similar effect as the above.

In the memory cell structure as above, a connection SNCT connecting between a storage node SN and a MOSFET source/drain diffusion layer is provided adjacent to the bit line BL, as clear from FIG. 11A. That is, in a sectional vertical direction, a parasitic capacitance exists between the memory-cell storage node and the bit line BL to form a signal path for conveying a potential change on the bit line BL to the storage node. Accordingly, it is beneficial to have mutual connection by the interconnection utilizing the plate electrode PL itself as in this embodiment.

Figure 1:
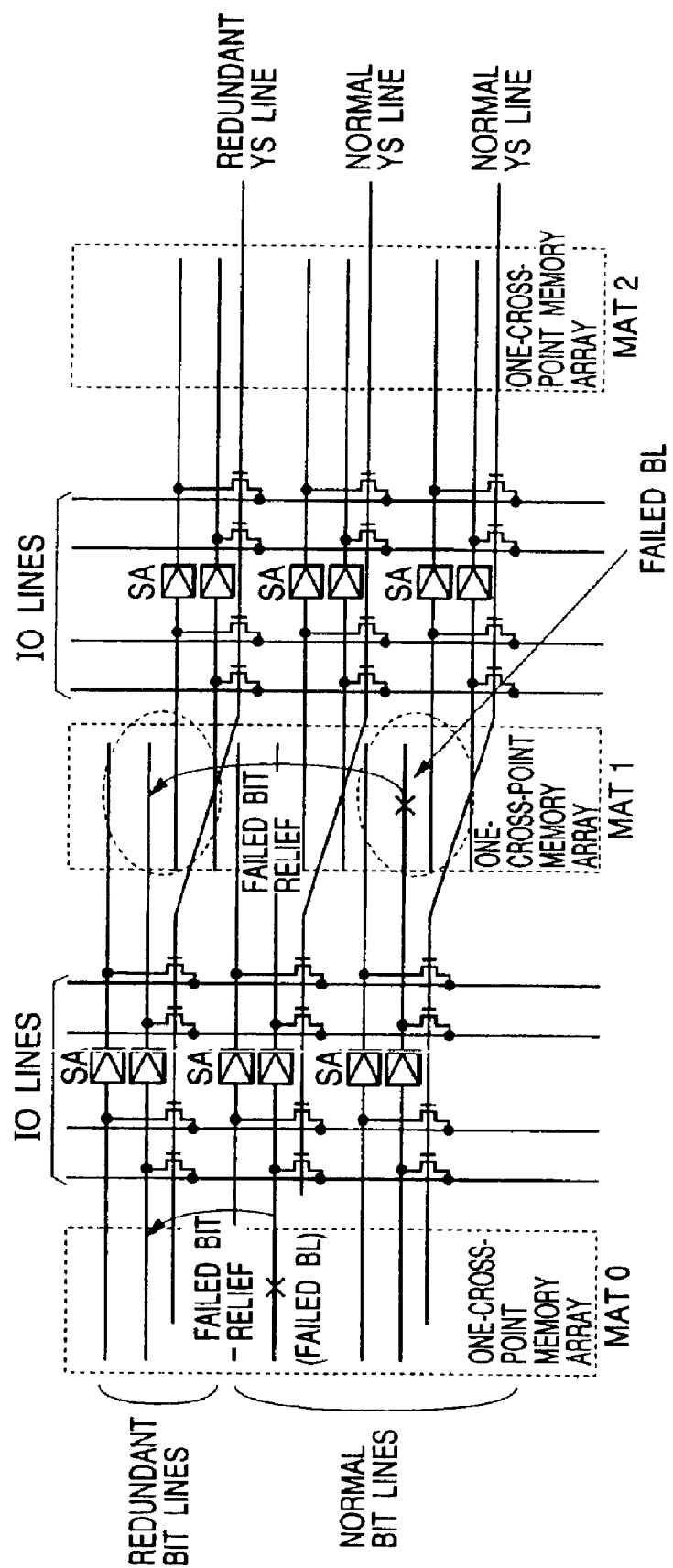
FIG. 1 is a schematic configuration diagram showing an embodiment of a dynamic RAM Y-system relief circuit according to the present invention.

FIG. 1 shows a schematic configuration view of one embodiment of a dynamic RAM Y-system relief circuit according to the invention. In this embodiment, when a failed BL (bit line) is detected on one memory array, determination is made as to whether the cause of the failed BL exists on a bit line itself or there is a failure in the memory cell itself. If it is determined that the failure exists in the memory cell itself, then the failed BL is changed to a redundant bit line.

That is, when a failed BL occurs in a mat 1 of a plurality of memory mats (hereinafter, referred merely to as mat) provided in a bit-line direction as above, i.e. exemplified mats 0–2 and the cause of the failure (defect) lies in the memory cell, X address information on the failed BL (mat-1 select information) is inputted to a not-shown Y relief circuit. A normal (ordinary) Y address for relief per mat is changed to a redundant (spare, relief) Y address, to relief the bit-line failure on a mat-by-mat basis by one redundant YS line provided corresponding to the plurality of divided bit lines.

By employing such a configuration, when a word line to mat 0 is selected and a normal bit line commonly to the failed BL and the sense amplifier SA is selected, the replacement to a redundant bit line as above is not made. The redundant bit line provided to the mat 0 can be used in a relief from another bit line to be selected by another normal YS line. This is true for a redundant bit line provided to another mat 2, and can be used to relieve a defective bit line in an address different from the mat 1. By implementing relief on each failed bit line among the complementary bit line pairs provided to the sense amplifier SA, it is possible to enhance the use efficiency over the redundant bit lines.

The block relief by only an X address of a failed (defective) bit line (mat select address) as in FIG. 1 is possible limited to the case that the cause of a failed bit line lies in a memory cell itself and that memory cell is satisfactorily not selected. That is, in the one-cross-point scheme as in this embodiment, if block relief as in FIG. 1 is made for a failed bit line in a stagger-arranged sense amplifiers SA as in FIG. 10A or the like, then relief is on only one of the bit lines. However, there exists a failure on a bit line itself in the case of failure in only one of the complementary bit lines. For weak leak or midway disconnection, poor marginality is to be assumed. Consequently, there arises a problem that, even if only one of the bit lines of the sense amplifier is detected in a probing test, there is a high probability that both bit lines are in failure when carrying out selection after assembling or installation on a system after shipment.

Figure 2:
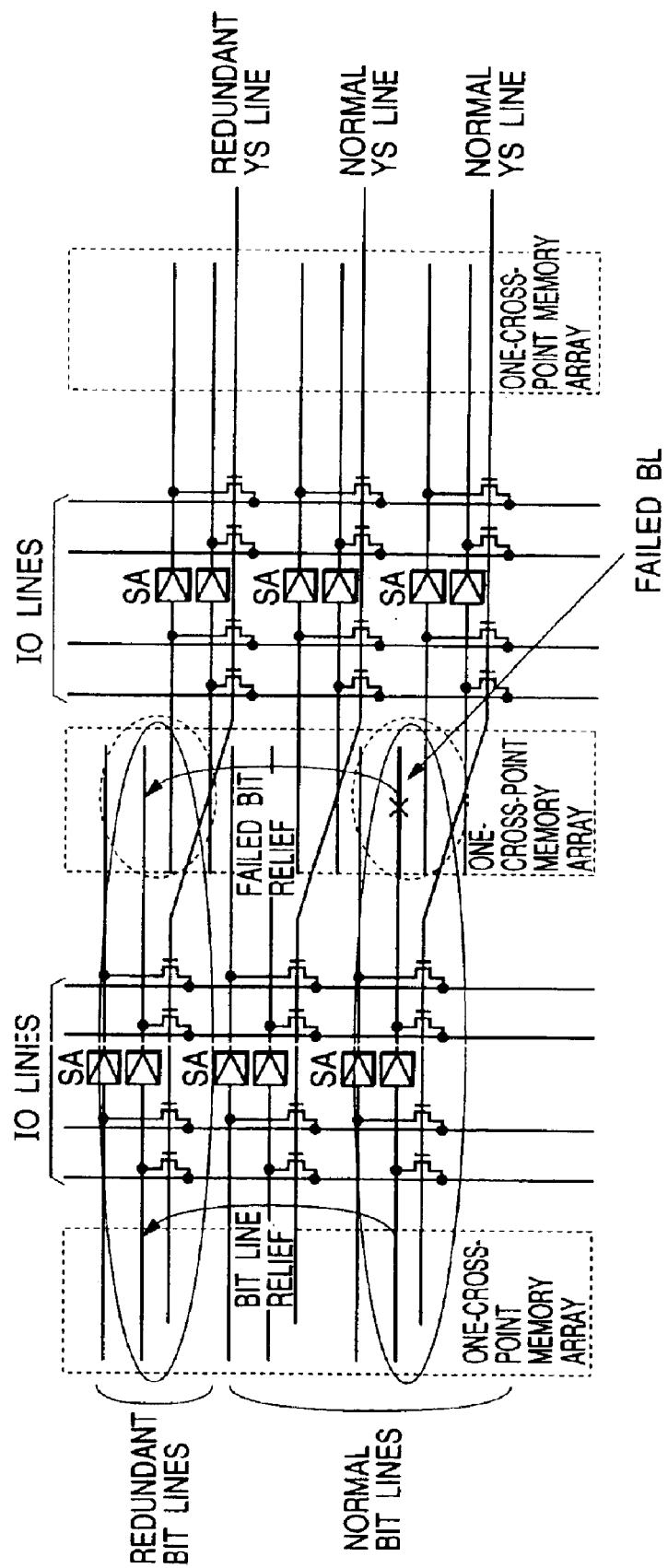
FIG. 2 is a schematic configuration diagram showing another embodiment of a dynamic RAM Y-system relief circuit according to the present invention.

FIG. 2 shows a schematic configuration view of another example of a dynamic RAM Y-system relief circuit according to the invention. In this embodiment, when a failed BL (bit line) is detected in one memory array and determined that a bit line itself is problematic, the bit line coupled to another input/output node of the sense amplifier connected to that bit line but determined as not failed in the probing test as above is relieved from the bit failure by changing, together with the failed BL, to a redundant bit line.

The determination criterion whether a memory cell itself is failure or a bit line itself is failure as the above can Use the number of memory cells rendered failure, for example. For example, where 512 memory cells are connected to one bit line, when there is a failure in one or two memory cells (X address), it can be determined that there is a failure in the memory cell itself. Where there are failures in number greater than that (X address), it can be determined that there is a failure in a bit line itself.

In a one-cross-point schemed memory array as above, if a bit-line pair of true and bar connected to one sense amplifier is to be simultaneously relieved, the mats that are to be simultaneously relieved by a main amplifier address (bit-line lowermost physical address) become different. Consequently, a fuse is cut by a failed-bit-line Y address (main address) to necessarily relieve the two mats on both sides of the sense amplifier SA on a block-relief basis. This can efficiently relieve a bit-line failure, even a failure occurred after the probing test, by a minimum number of fuse sets.

That is, in the one-cross-point schemed memory array, the true and bar of a bit line is arranged to an adjacent mat. Accordingly, even where one of the true line and the bar line is failed or the bit line is failed in its midway, when the cause is on the bit line itself, pass is made at the margin without making relief in spite of the presence of a failure. This results in a factor of reducing the probing test yield or selection yield in a second round after the above relief. In this embodiment, even where only one of the true and bar lines is in a failure as above in the first round of probing test, relief is made for all the bit lines connected to the same sense amplifier SA as the failed bit line is connected.

Figure 3:
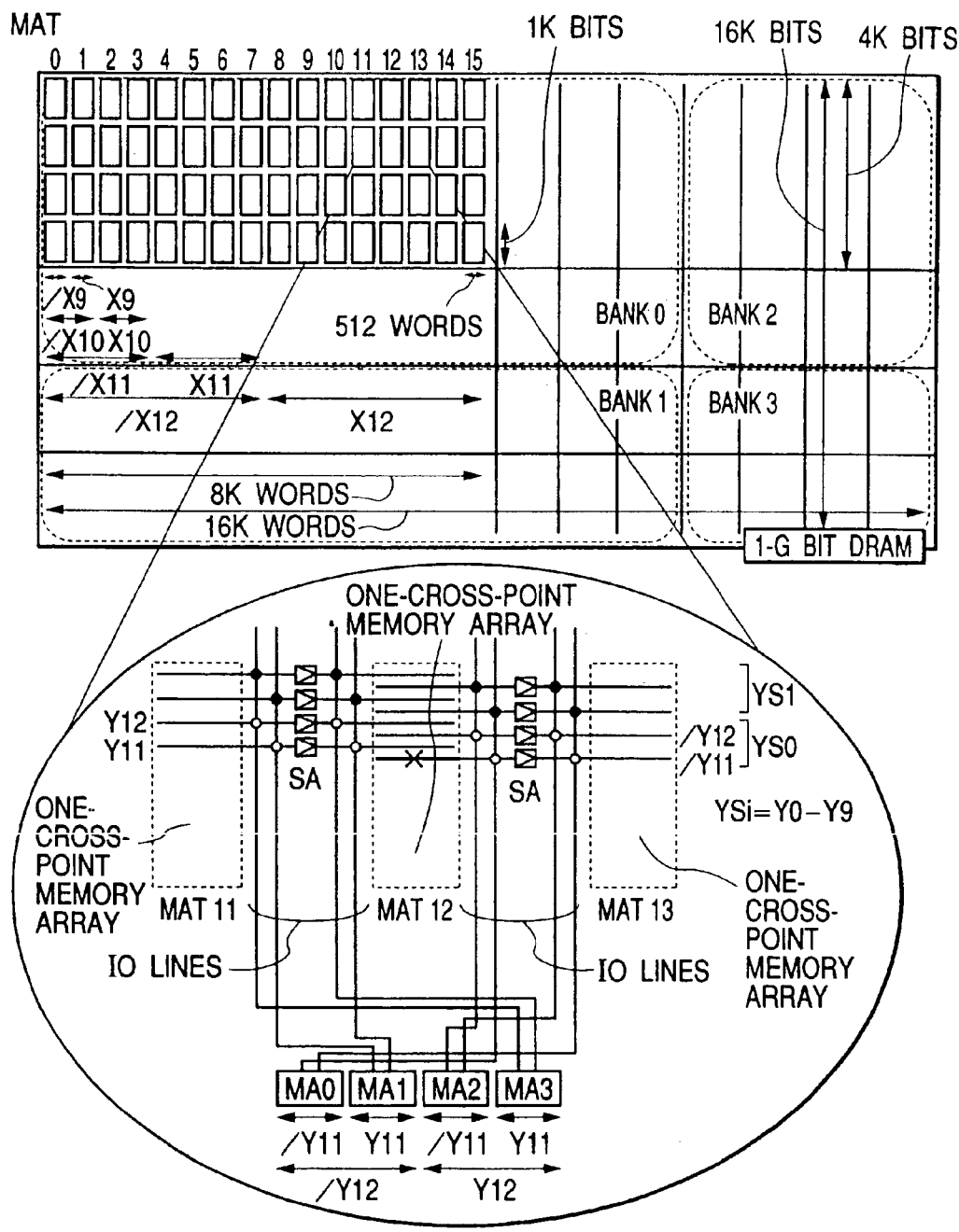
FIG. 3 is a schematic block diagram showing an embodiment of a dynamic RAM Y-system relief circuit according to the present invention.

FIG. 3 shows a schematic block diagram of an embodiment of a dynamic RAM Y-system relief circuit according to the invention. This embodiment is directed to a DRAM of approximately 1G(giga) bits and divided in the entirety into four memory banks 0 to 3. In the individual memory bank, sixteen mats having mats 0–15 are arranged in four arrays. The individual mat is given 1K bits×512 words, as described before. Totally four groups, each group of mats having 16×4, are provided in the bit-line direction, and two groups in the word-line direction. Accordingly, one memory bank has such a storage capacity as 4K (bits)×2×8K (words)×4=256 M (bits). Because such memory banks are provided four in the number, the total storage capacity is given 1G bits in total.

The sixteen mats 0–15 are designated by a complementary address signal having four bits X address signals /X9, X9 to /X12 and X12. Herein, /X9 represents a Bar signal while X9 a True signal.

Because the bit lines having 4K formed by four mats arrayed in the word-line direction have 4 pairs of bit lines to be selected by one YS line, totally 1024 YS lines are provided. On the YS lines, a select signal for one YSi (1/1024) is to be formed by an address signal having 10 bits of Y address signals Y0–Y9.

In this embodiment, 4-bit input/output is possible on the basis of the 16×4 mats as one unit. In this embodiment, such mats are provided two sets in the word-line direction and four sets in the bit-line direction. Consequently, if one word line is selected in each set, the data of 4×2×4=32 bits in maximum can be inputted/outputted. Where 1 bit is read out of each set, 1×2×4=8 bits is possible to read out. Where selecting one from the vertical two sets by the Y system selection operation, memory access is possible on a 4-bit basis.

In the case of reading 1 bit from each set, there is a need to select one main amplifier from among the four main amplifiers MA0–MA3 provided corresponding to the four pairs of IO lines. In order to select one main amplifier from the main amplifiers MA0–MA3, Y address signals /Y11, Y11 and /Y12, Y12 are employed. That is, the bit lines in four pairs to be selected by YS0 can be designated by the Y address /Y11, Y11 and /Y12, Y12 corresponding to the main amplifier MA0–MA3.

In the case that a pair of IO lines are selected from the four pairs of IO lines as in this embodiment and a failure exists on a bit line itself as mentioned before, when the failure is on a bit line fallen under a main-amplifier address /Y11 (MA0) by mat-12 YS0, then the mat-13 YS0 corresponding thereto is relieved at the same time. When the failure is on a bit line fallen under a main-amplifier address Y11 (MA1) by YS0 of the mat 12, the mat-11 YS0 is relieved at the same time.

Figure 4:
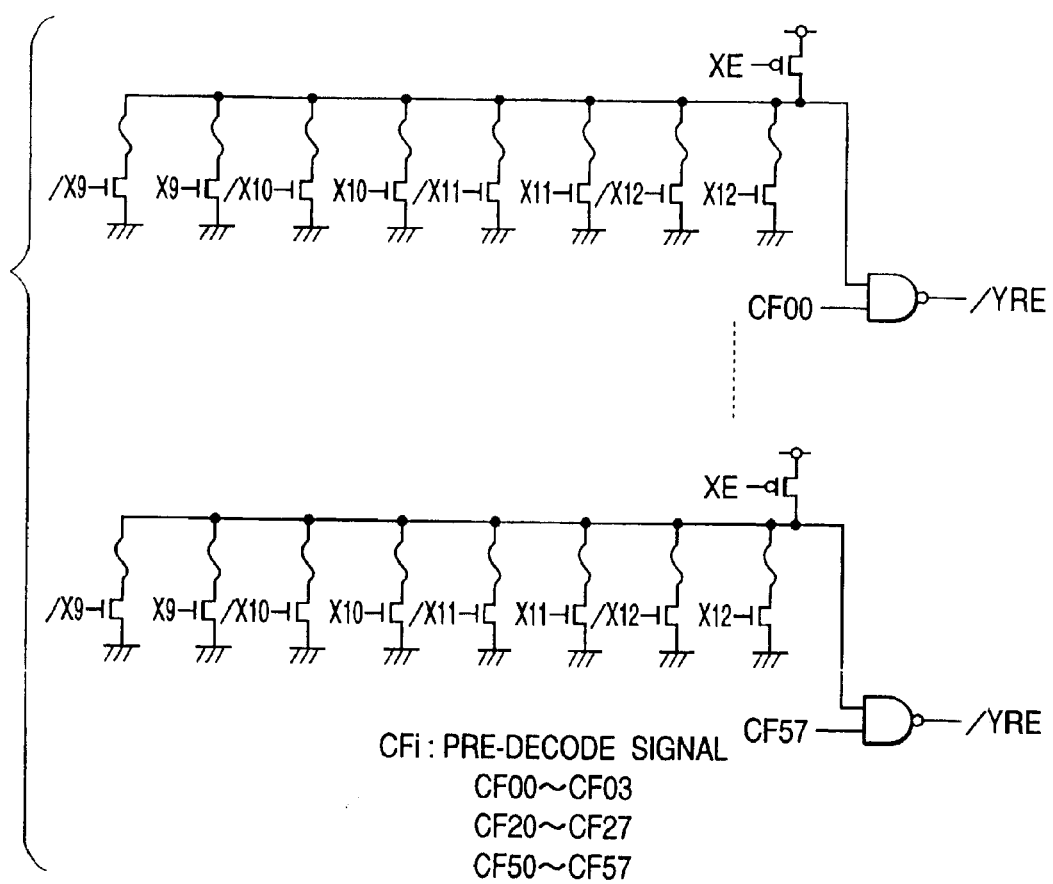
FIG. 4 is a circuit diagram showing an embodiment of a Y-redundant circuit according to the invention.

FIG. 4 shows a circuit diagram of an embodiment of a Y-redundant circuit according to the invention. That is, address signals /X9, X9–/X12, X12 are supplied respectively to the gates of eight N-channel MOSFETs. The MOSFET has a fuse between its drain and output line. The output line is provided with a pre-charge P-channel MOSFET to be turned to on state by a signal XE. Each MOSFET is turned to on state corresponding to a high level in the address signals /X9, X9–/X12, X12. Consequently, the pre-charge voltage on the output line is discharged, only where the fuse corresponding to an MOSFET turned in on state is not blown. When the MOSFET is in off state or the fuse is blown despite the MOSFET is in on state, the output line maintains the pre-charge voltage. Thus, mat designation can be made based on non-occurrence of discharge on the output line by the utilization of the combination of MOSFET on/off states and the presence/absence of fuse blow.

The mat select addresses (X9–X12) may be made in a Don't care relief scheme having true/bar fuses as in the above. For example, in FIG. 3, when a pair of mats (0 and 1, 2 and 3, or the like) to be selected by X address signals /X9 and X9 are simultaneously selected, the fuses on both /X9 and X9 and one of the remainders X10–X12 may be blown. Due to this, Don't care is given to the address X9 of the sixteen mats to thereby select 8 sets on a 2-mats basis. Simultaneous selection of the two mats is made possible by such a simple circuit.

In address assignment of FIG. 3, when selecting a pair of mats 1 and 2, 3 and 4 or the like as two memory mats at the boundary between /X10 and X10, the fuses may be blown of both /X9 and X9–/X10 and X10 as well as one of the remainders X11–X12. When selecting a pair of mats 3 and 4, 7 and 8 or the like as two memory mats at the boundary between /X11 and X11, the fuses may be blown of both /X9 and X9–/X11 and X11 as well as one of the remainder X12. When selecting a pair of mats 8 and 9 as two memory mats at the boundary between /X12 and X12, the fuses may be blown of both /X9 and X9–/X12 and X12. With such a simple Don't care scheme, there arises a case that the entire one YS must be replaced upon relieving mats 7 and 8 as in the above. In this case, if using two fuse sets, the efficiency of relief will improve.

In the simple Don't care scheme like this, the circuit for failure-address storage and comparison can be simplified in the above manner. On the contrary, where the mat address is divided by a mat upper-order address, the mat to be designated by a lower-order address is also selected. Because changing is made to a redundant bit line even when no failure exists on the bit line, sacrificed is the use efficiency for the redundant bit lines. Where selecting two mats as a pair, a fuse and comparison circuit may be provided to designate the two mats. Besides, two mats may be designated by internally providing logic for making the mat select address ±1.

In this embodiment, the fuses and the address comparison circuit are provided corresponding to Y (column) pre-decoder signals CF00–CF57. In this configuration, simplification of circuit is feasible because one YS line is to be selected from 1024 YS lines by the combinations in the number of 4+8+8=20.

Figure 5:
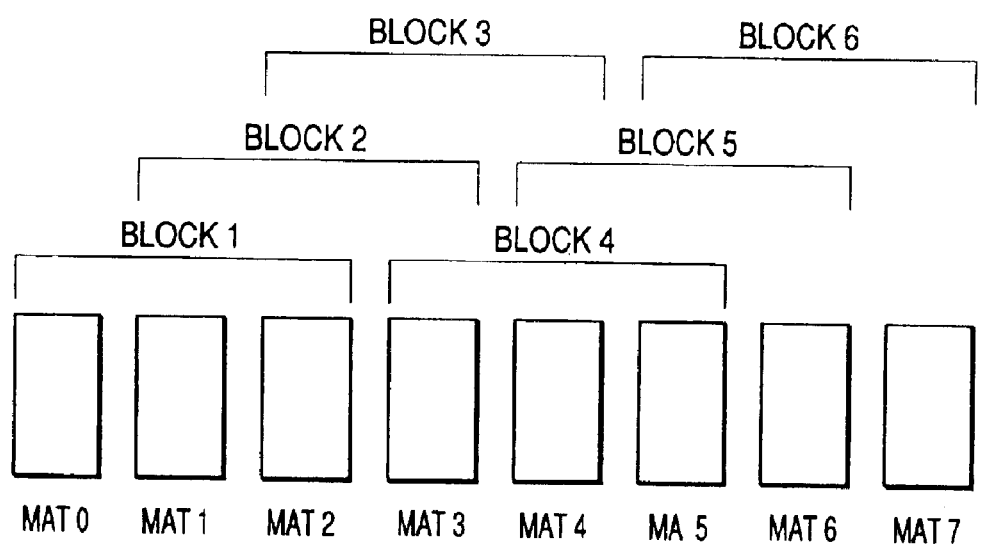
FIG. 5 is a configuration diagram showing another embodiment of a Y-system relief circuit according to the invention.

FIG. 5 shows a configuration diagram of an embodiment of a Y-system relief circuit according to the invention. In this embodiment, an algorithm is simply provided to simultaneously relieve, without fail, three mats of a failed bit line and the adjacent mats. That is, when a certain address is designated, three mats added with the adjacent ones are taken as a block-relief unit. When eight mats are included as in the figure, division is made into six blocks so that three blocks (mats) are selected at one time by one relief address thereby changing the bit line into a redundant bit line. When including 16 mats as in FIG. 3, division is into 14 blocks.

Figure 6:
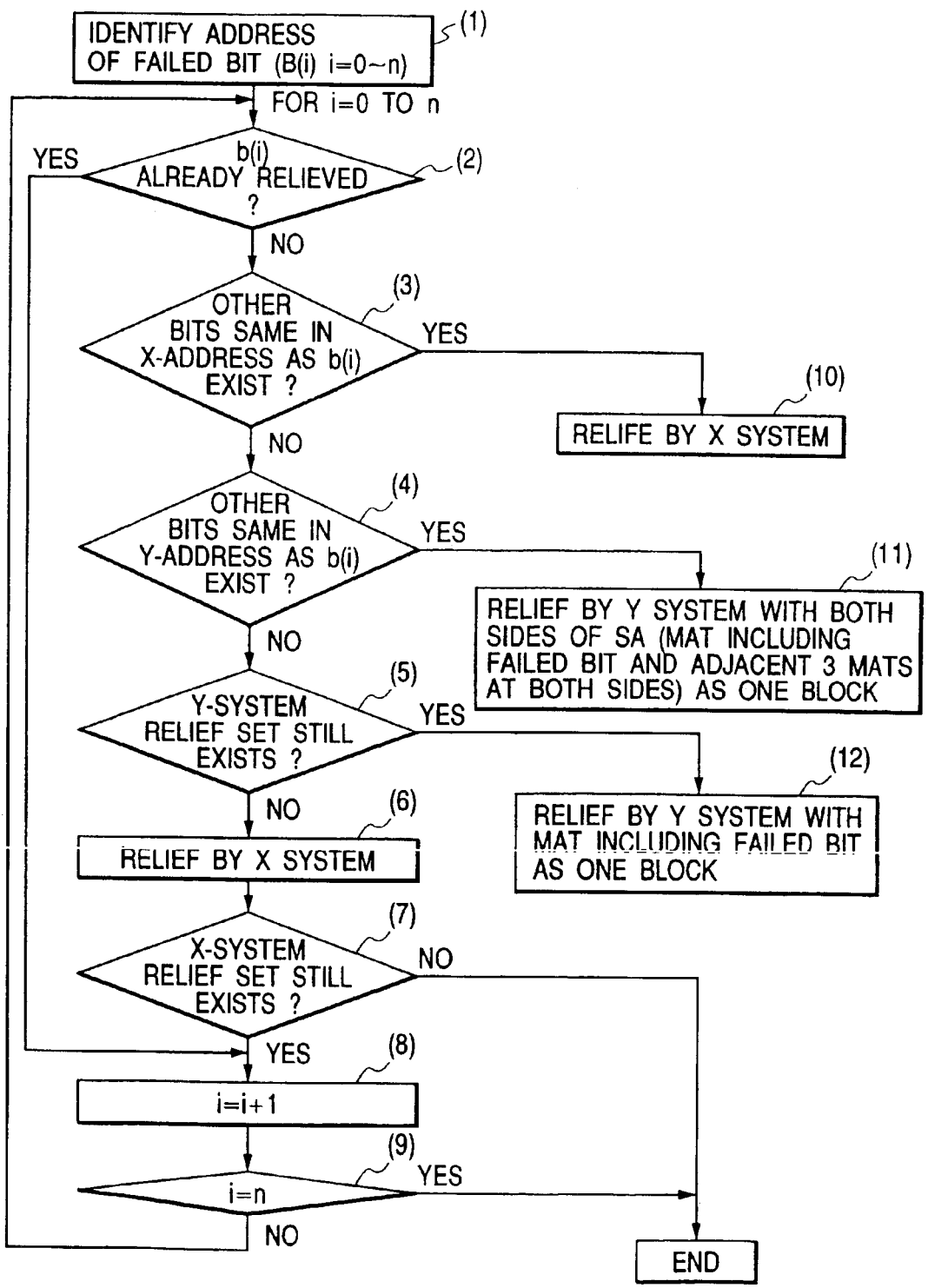
FIG. 6 is a flowchart of an embodiment for explaining a defect relief method for a DRAM according to the invention.

FIG. 6 shows a flow chart of an embodiment for explaining a DRAM defect relief method according to the invention. In step (1), an address of a failed bit is inputted. In step (2), determination is made whether a certain failed bit (bi) is already relieved. If already relieved, movement is to step (8). As hereinafter described, in step (8) update is made to the next failed bit. If not relieved, determination is made in step (3) whether there is another one of bit in the same X address as (bi). When existing, relief is made with X system in step (10).

In the step (3), when there is no bit in the X address, it is determined in step (4) whether another failure exists in a Y-address bit. When existing, relief is made by taking the opposite sides of the sense amplifier SA as one block in the step (11). That is, block relief is made as in the embodiment of FIG. 2 or the embodiment of FIG. 5. Where there are a plurality of bit failures in the same Y address as described before, it is considered that the bit line itself is defective. The bit lines on the opposite sides of the sense amplifier as in the above are rendered as failed bit lines and replaced with redundant bit line.

When in step (4) there is no another bit in the Y address, determination is made in step (5) where there is another Y-system relief set (fuse set or address comparison circuit). Where such a relief set exists, relief is made in step (12) by taking as one block only mats including failure bit. That is, as in the embodiment shown in FIG. 1, only the failed bit line on one side of the sense amplifier SA is changed to a redundant bit line.

In step (4), if determined there is no Y relief set, in step (6) relief is made by the X system. In step (7), it is determined where there is still a relief set in the X system. When there is no X-system relief set, relief is impossible and the process is ended. Where there is still an X-system relief set, in step (8) movement is to the next bit bi+1. In step (9), if it has been determined whether relief has been made to the final bit, the process is ended. If not the final bit, return is to step (2).

In this embodiment, determination is made whether a bit failure is a failure of a memory cell itself or a failure of a bit line itself. By selecting a relief scheme suited for the respective cases, the redundant bit line in reduced amount can be used efficiently and a failure that would occur after probing test be relieved in advance. Incidentally, as was shown in FIGS. 11A and 11B, where two memory cells are connected by a contact BLCT, two the memory cells are rendered as failed cells at the same time in such connection failure occurs. Consequently, the failed cells in such a pair even if they are two are determined as a failure in the memory cell itself, in its address to steps (4) and (5) Thus, only the mat including failed bit is relieved as one block.

Figure 7:
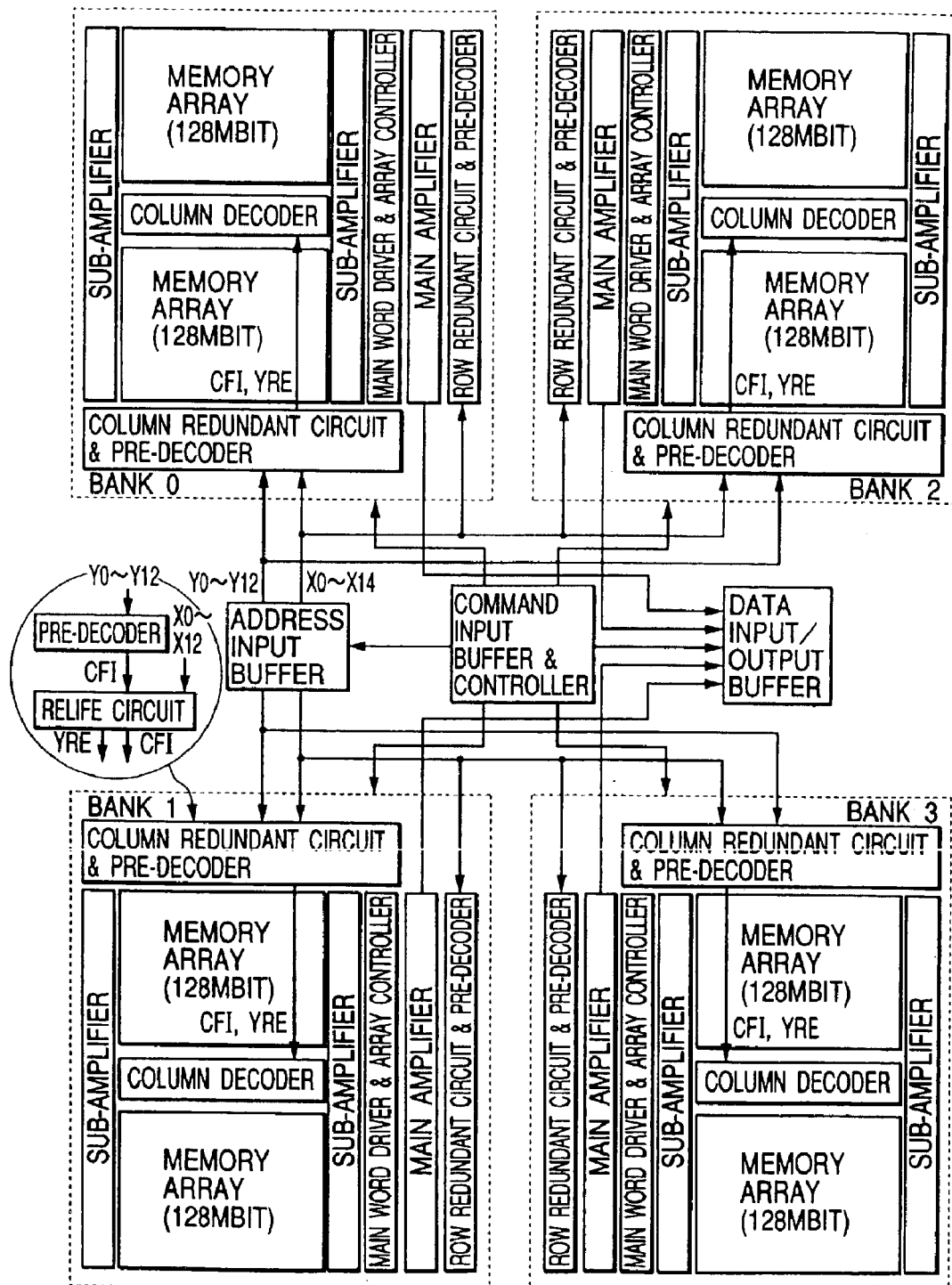
FIG. 7 is an overall block diagram showing an embodiment of an SDRAM to which the invention is applied.

FIG. 7 shows an overall block diagram of an embodiment of an SDRAM (Synchronous Dynamic Random Access Memory) to which the invention is applied. The SDRAM of this embodiment, although not limited, has four memory arrays corresponding to four memory banks (hereinafter, referred merely to as bank). The memory arrays corresponding to the four banks 0–3 are divided into two with respect to a column decoder as a center, and have dynamic memory cells matrix-arranged. According to the figure, the select terminals of memory cells arranged on the same row are coupled to a word line (not shown) on a row-by-row basis. The data input/output terminals of memory cells arranged on the same line are coupled to a bit line (not shown) on a line-by-line basis.

The one bank has two 128 M-bit memory arrays and hence such a storage capacity as 256 M-bits. The sub-amplifier is provided on an IO line formed in a manner extending a sense-amplifier array, to amplify the signal on the IO line. The bit line and redundant bit line of the memory array is selected by a column redundant circuit & pre-decoder. The word line and redundant word line of the memory arrays is selected by a row redundant circuit & pre-decoder. The word lines are made in a hierarchical word-line scheme having main word lines and sub-word lines, wherein the main word line is to be selected by a main-word driver.

The memory array is formed by a plurality of memory mats as mentioned before. In a region between the memory mats are provided sense amplifiers SA, column switches and sub-word drivers SDW. The main amplifier amplifies selected one of the IO lines and outputs data, although not limited, of 16 bits through an output circuit provided in a data input/output buffer. The 16-bit write data inputted to the input circuit provided in the input/output buffer is conveyed to an IO line and select bit line as selected through a select circuit of the main amplifier, thereby being written to the memory cell.

The address signal is once held in an address input buffer. Among the address signals inputted in time series, a row-system address signal is supplied to the row redundant circuit & pre-decoder. A column-system address signal is supplied to the column redundant circuit & pre-decoder. Incidentally, although not shown, a refresh counter is provided to generate a line address during automatic refresh and self refresh. In a column address circuit, a column counter is provided to generate a column address corresponding to a burst mode or the like designated by a command and output it toward a column pre-decoder.

A command/input buffer & controller includes a mode register to hold various-operation mode information. The controller, although not especially limited, is supplied with external control signals, such as clock signal CLK, /CLK, clock enable signal CKE, chip select signal /CS, column address strobe signal /CAS, row address strobe signal /RAS and write enable signal /WE, and address signals through /DM and DQS and mode register 213. Based on level change or timing of these signals, an internal timing signal is formed to control SDRAM operation mode and operation of the above circuit blocks. Each is provided with an input buffer corresponding to the signals.

Other external input signals are made significant in synchronous with a rise edge of the internal clock signal. The chip select signal ICS instructs to start a command input cycle by a low level of the same. The chip select signal /CS in a high level (chip non-select state) or other inputs do not have meaning. However, internal operations such as memory bank select state or burst operation are not affected by the change to the chip non-select state. The signals /RAS, /CAS and /WE are different in function from the corresponding signals for the usual DRAM, and made as significant signals when defining a command cycle, hereinafter referred.

The clock enable signal CKE is a signal to instruct effectiveness for the next clock signal. If the signal CKE is in high level, the next clock signal CLK at a rise edge is made effective. When in low level, it is made ineffective. Incidentally, in a read mode, where providing an external control signal /OE to control output enable for the data output buffer, the same signal /OE is also supplied to the controller. When that signal is, for example, in high level, the data output buffer is made in a high-output impedance state.

The row address signal is defined a level of the address signal in a row address strobe ● bank active command cycle, hereinafter referred, synchronous with a rise edge of the clock signal CLK (internal clock signal).

For example, the address signals A13 and A14 are reconsidered as bank select signals in the row address strobe ● bank active command cycle. That is, by a combination of A13 and A14, one is selected of the four memory banks 0–3. Memory-bank select control, although not limited, can be made by a process of activation of only a row decoder on a selected memory bank side, non-selections of all the column switch circuits on a non-selected memory bank side, connection to the data input circuit 210 and data output circuit only on the selected memory bank side, or the like.

In the SDRAM, during burst operation in one memory bank, if another memory bank is designated in the course of the operation and a row address strobe ● bank active command is supplied, the row address system in the other memory bank is enabled in operation without having any effect upon the one memory bank under execution.

Accordingly, unless there is no data collision at the data input/output terminals, for example, of 16 bits, it is possible to issue pre-charge commands and row address strobe ● bank active commands to a different memory bank from the memory bank being processed by the commands under execution during command execution before ending the process thereby previously staring internal operation.

Figure 8:
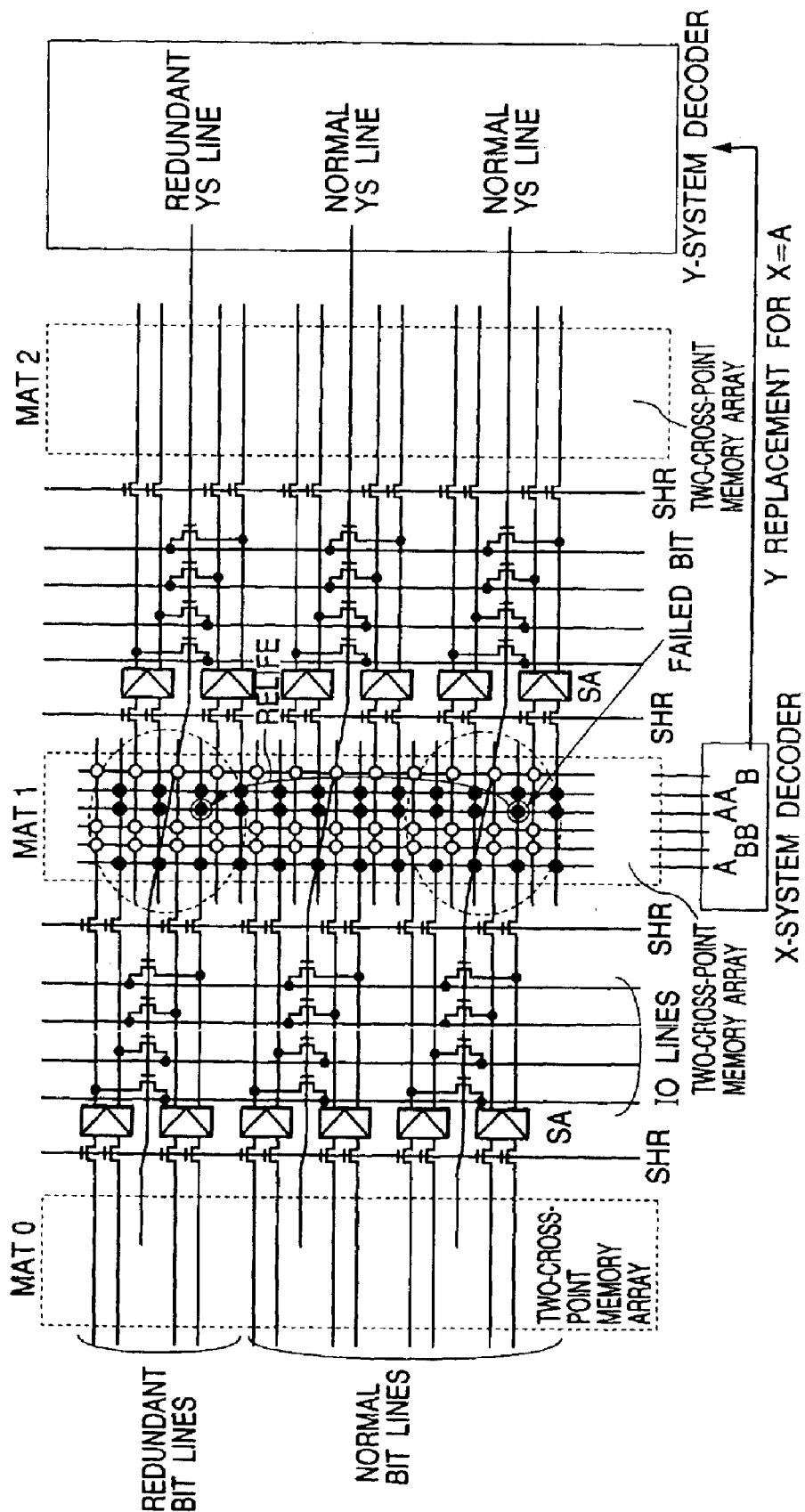
FIG. 8 is a schematic configuration diagram showing still another embodiment of a dynamic RAM Y-system system relief circuit according to the present invention.

FIG. 8 shows a schematic configuration diagram of a further embodiment of a dynamic RAM Y-system relief circuit according to the invention. In this embodiment, memory arrays provided on opposite sides of sense amplifiers SA as center are arranged with complementary bit lines in pair in parallel. That is, bit-line true and bar are provided parallel with a memory array, providing so-called a two-cross-point scheme. The sense amplifier SA amplifies the signal on the bit-line pair provided either one of the memory arrays due to time share by a shared switch MOSFET.

In this manner, two-cross-point scheme extending in parallel complementary bit-line pairs each provided corresponding to one pair of input/output nodes of the sense amplifier SA. In the dynamic RAM employing shared sense amplifiers used in a time-divisional fashion for two pairs of complementary bit lines extending in a manner sandwiching the sense amplifier, where in order to secure read-out signal amount from a memory cell the bit lines are divided to decrease the number of memory cells connected to them, it is possible to relief a failed bit line on the basis of a mat corresponding to the divided bit lines. That is, X address (mat) information of a failed bit is inputted to the Y relief circuit to change a normal Y address to be relieved on each-mat basis into a redundant Y address. Thus, bit line failure is relieved on each-mat basis by one redundant YS line provided corresponding to a plurality of divided bit lines.

In the two-cross-point schemed dynamic RAM as above, with the bit-line relief technique on each-mat basis used, even where a failure exists on a memory cell itself as above, replacement is made by a bit-line pair into a redundant bit-line pair. Consequently, use efficiency thereof worsens because of replacement on a one-pair basis at all times. Therefore, in the present embodiment even of the two-cross-point scheme, where a failure exists on a memory cell itself, a bit line only is replaced of a bit-line pair having failed cell into a redundant bit line.

That is, when a failure BL occurs in mat 1 of the mats 0 to 2 provided in the bit-line direction exemplified in the figure and the cause of failure is present in a memory cell, Y-address information (bit-line true-A or Bar-B signal) of the failed BL is supplied to a Y-system decoder of a Y-relief circuit, not shown. As shown in the figure, if the failed bit X is A, switching is made to a redundant Y address to replace with one (A-side) of the redundant bit-line pair provided corresponding thereto. This can use the other (B side) of the redundant bit-line pair in relieving of a failure on the other side, B-side, of another bit-line pair that the cause of failure is on the memory cell within the common mat as mentioned above. Because the true and bar of a redundant bit-line pair can be used respectively in relieving a true and a bar of a normal bit-line pair as above, it is possible to enhance the efficiency of use of redundant bit-line pairs.

With this configuration, when a word line for example of mat 0 is selected and a normal bit line common in failure BL and sense amplifier SA, replacement as above is not made to a redundant bit line. The redundant bit line provided to the relevant mat 0 can be used in relieving failed another bit line to be selected by another normal YS line. This is true for a redundant bit line provided to other mat 2, i.e. usable in relieving a failed bit line different in address from mat 1. By relieving each failed bit line of a complementary bit-line pair provided to a sense amplifier SA, it is possible to enhance the efficiency of using the redundant bit lines.

The above embodiments provide the operations and effects as the followings.

(1) An effect of realizing effective and rational Y-system relief is obtained by arranging in a bit-line direction a plurality of memory mats including a plurality of memory cells respectively coupled to bit lines and word lines, and arranging a sense amplifier array including a plurality of latch circuits having input/output nodes connected to a half of bit-line pairs separately provided to the memory mats in a region between the memory mats placed in the bit-line direction, and making possible to replace with a redundant bit line pair and the corresponding redundant sense amplifier on a basis of each bit-line pair and sense amplifier connected thereto.

(2) An effect of enhancing the use efficiency of redundant bit lines is obtained by arranging in a bit-line direction a plurality of memory mats including a plurality of memory cells respectively coupled to bit lines and word lines, arranging a sense amplifier array including a plurality of latch circuits having input/output nodes connected to a half of bit-line pairs separately provided to the memory mats in a region between the memory mats placed in the bit-line direction, and making possible to replace a failed bit line with a redundant bit line and the corresponding redundant sense amplifier on a bit-line basis of the bit-line pair.

(3) In addition to the above, an effect of realizing effective bit-line relief is obtained by limiting the failed bit line to a failure as determined due to the presence of a failure on a memory cell itself.

(4) In addition to the above, an effect of enhancing the use efficiency of redundant bit lines and sense amplifiers is obtained by selecting a bit line on the memory mats arranged in the bit-line direction by a common Y-line select signal, making possible to replace the redundant bit line and sense amplifier correspondingly to each memory mat by the memory-mat select signal.

(5) In addition to the above, an effect of simplifying a failure-address memory circuit and its comparison circuit is obtained by replacing also the bit lines on the memory mats arranged on the both sides in the bit-line direction into redundant bit lines redundant and sense amplifiers with respect to as a center the memory mat among the memory mats that a failed bit line exists.

(6) In addition to the above, an effect of realizing effective failed-bit-line relief is obtained by limiting the failed bit line to a failure as determined due to the presence of a failure on a bit line itself.

(7) In addition to the above, an effect of simplifying a failure-address memory circuit and its comparison circuit is obtained by replacing collectively the bit lines on the three memory mats, i.e. the memory mat having the failed bit line and the memory mats on the both sides thereof, into redundant bit lines and redundant sense amplifiers respectively corresponding to them by a set of failure-address memory circuit for designating said failed bit line.

(8) In addition to the above, an effect of rationally arranging circuits required for read operation in a dynamic memory cell is obtained by further including a plurality of first complementary input/output lines extended along the sense amplifier array, and providing the sense amplifier array with a pre-charge circuit to supply an intermediate voltage of operation voltage of the sense amplifier to the complementary bit-line pair and a pair of switch MOSFETs having a gate to receive the Y-select signal and provided between the bit-line pair provided separately to the two memory mats and the first complementary input/output line.

(9) In addition to the above, an effect of simplifying the failure-address memory and its comparison circuit is realized by configuring a circuit for comparing failure-address memory means with an input address signal by fuse means to be selectively blown correspondingly to a failure address, a switch MOSFET provided between one end of the fuse means and a first voltage to be supplied with a complementary address signal, and pre-charge means provided common to the other end of the fuse means to supply a pre-charge voltage having a second voltage, thereby forming an agreement/non-agreement signal through the other end made common of the fuse means.

(10) An effect of realizing rational Y-system relief is obtained by a plurality of memory array regions arranged in a first direction and a plurality of sense amplifier regions arranged alternate therewith; each of the memory array regions having a plurality of bit lines extending in the first direction, a plurality of word lines extending in a second line orthogonal to the first line and a plurality of memory cells corresponding to intersections between the bit lines and the word lines; each of the sense amplifier region having therein a first sense amplifier connected to a first bit line in one region of the memory array regions on adjacent both sides of each sense amplifier region and a second bit line in the other region thereof and a second sense amplifier connected to a first redundant bit line in the one region and to a second redundant bit line in the other region; whereby, in the case that the first bit line in one memory array region is replaced with the first redundant bit line, the second bit line is to be replaced with the second redundant bit line.

(11) An effect of realizing effective and rational Y-system relief is obtained by a plurality of memory array regions arranged in a first direction; a plurality of sense amplifier regions arranged alternate therewith; each of the memory array regions having a plurality of bit lines extending in the first direction, a plurality of word lines extending in a second line orthogonal to the first line and a plurality of memory cells corresponding to intersections between the bit lines and the word lines; each of the sense amplifier region having therein a first sense amplifier connected to a bit line in one region of the memory array regions on adjacent both sides of each sense amplifier region and a bit line in the other region thereof and a second sense amplifier connected to a redundant bit line in the one region and to a redundant bit line in the other region; whereby, in the case that a redundant bit line is selected in place of a predetermined bit line in one memory array region, the redundant bit line is selected in place of the predetermined bit line in the memory array regions on both sides of the one memory array region.

(12) An effect of realizing effective and rational Y-system relief is obtained by a plurality of memory array regions arranged in a first direction; and a plurality of sense amplifier regions arranged alternate therewith; each of the memory array regions having a plurality of bit lines extending in the first direction, a plurality of word lines extending in a second line orthogonal to the first line and a plurality of memory cells corresponding to intersections between the bit lines and the word lines; each of the sense amplifier region having therein a first sense amplifier connected to a first bit line in one region of the memory array regions on adjacent both sides of each sense amplifier region and a second bit line in the other region thereof and a second sense amplifier connected to a first redundant bit line in the one region and to a second redundant bit line in the other region, whereby, effected in one memory array region are bit relief to replace the first bit line with the first redundant bit line and bit relief, where in another memory array region the redundant bit line is selected in place of a predetermined bit line, to select the redundant bit line in place of the predetermined bit line in the memory array regions on both sides of the other memory array region.

(13) An effect of realizing effective and rational Y-system relief is obtained by a plurality of memory array regions arranged alternately; a plurality of sense amplifier regions arranged alternate therewith; each of the memory array regions having a plurality of bit line pairs extending in the first direction, a plurality of word lines extending in a second line orthogonal to the first line and a plurality of memory cells corresponding to intersections between ones of the bit line pairs and the word lines; each of the sense amplifier region having therein a first sense amplifier connected to a first bit line in one region of the memory array regions on adjacent both sides of each sense amplifier region and a second bit line in the other region thereof and a second sense amplifier connected to a first redundant bit line in the one region and to a second redundant bit line in the other region; whereby, effected in one memory array region can be bit relief on a bit-line basis to replace the first bit line that failure exists on the memory cell with corresponding one of the first redundant bit lines and bit relief on a bit-line-pair basis, when in one memory array region failure exists on the first bit line, to replace both of the first and second bit lines with the first and second redundant bit lines.

Although the invention made by the present inventor was explained in detail based on the embodiments, it is needless to say that the invention is never limited to the embodiments but is to be modified in various ways within a range without departure from the gist thereof. For example, the word lines may be formed by a two-layered structure with a metal layer, besides the foregoing hierarchical word-line scheme. The dynamic-RAM input/output interface may be adapted to various types such as DDR SDRAM and SDRAM besides SDRAM, and the dynamic RAM may be incorporated in a digital integrated circuit. The invention can be broadly utilized for the semiconductor devices, such as dynamic RAM, having sense amplifiers arranged in a stagger form by a one-cross-point or two-cross-point scheme.

The effect representatively offered by the inventions disclosed in this description will be briefed below. A plurality of memory mats including a plurality of memory cells coupled to bit lines and word lines are arranged in the bit-line direction. In a region between the memory mats arranged in the bit-line direction, a sense amplifier array is provided including a plurality of latch circuits having input/output nodes connected to a half of bit line pairs separately provided to the memory mats, making possible to replacing redundant bit-line pairs and the corresponding redundant sense amplifiers on a basis of each bit-line pair and sense amplifiers connected thereto. Thus, effective and rational Y-system relief can be realized.

We claim:
1. A semiconductor memory device, including:
a first bit line;
a second bit line;
a first redundant bit line;
a second redundant bit line;
a plurality of first memory cells connected to said first bit line;
a plurality of second memory cells connected to said second bit line;
a plurality of first redundant memory cells connected to said first redundant bit line;
a plurality of second redundant memory cells connected to said second redundant bit line;
a first amplifier circuit connected to said first bit line and said second bit line to amplify a difference of potential between said first bit line and said second bit line; and
a first redundant amplifier circuit connected to said first redundant bit line and said second redundant bit line to amplify a difference of potential between said first redundant bit line and said second redundant bit line,
wherein said first bit line is to be replaced with said first redundant bit line but said second bit line is not to be replaced with said second redundant bit line.

2. A semiconductor memory device according to claim 1, wherein said first bit line and said first redundant bit line are included in a first memory array,
said second bit line and said second redundant bit line being included in a second memory array, and
said first amplifier circuit and said first redundant amplifier circuit being formed in a region between said first memory array and said second memory array.

3. A semiconductor memory device according to claim 2, wherein said second memory array further includes a third bit line,
said semiconductor memory device further including a third memory array including a fourth bit line and a second amplifier circuit connected to said third bit line and said fourth bit line to amplify a potential difference between said third bit line and said fourth bit line; and
said second amplifier circuit being formed in a region between said second memory array and said third memory array.

4. A semiconductor memory device according to claim 1, wherein said first bit line, said second bit line, said first redundant bit line and said second redundant bit line are included in said first memory array,
said first bit line and said second bit line being arranged in parallel; and
said first redundant bit line and said second redundant bit line being arranged in parallel.

5. A semiconductor memory device according to claim 4, wherein said first memory array further includes a third bit line and a fourth bit line,
said semiconductor memory device further including a second amplifier circuit connected to said third bit line and said fourth bit line to amplify a potential difference between said third bit line and said fourth bit line;
said first amplifier circuit and said first redundant amplifier circuit being formed in a first region;
said second amplifier circuit being formed in a second region; and
said first memory array being formed in a region between said first region and said second region.

6. A semiconductor memory device according to claim 1, wherein said first bit line, said second bit line, said first redundant bit line and said second redundant bit line are included in a first memory array.

7. A semiconductor memory device, including:
- a plurality of first normal bit lines;
- a plurality of second normal bit lines;
- a first redundant bit line;
- a second redundant bit line;
- a plurality of first normal memory cells connected to said plurality of first normal bit lines;
- a plurality of second normal memory cells connected to said plurality of second normal bit lines;
- a plurality of first redundant memory cells connected to said first redundant bit line;
- a plurality of second redundant memory cells connected to said second redundant bit line;
- a plurality of first amplifier circuits connected to said plurality of first bit lines and said plurality of second bit lines;
- a second amplifier circuit connected to said first redundant bit line and said second redundant bit line to amplify a potential difference between said first redundant bit line and said second redundant bit line; and
- an information hold circuit which holds information about replacement of a normal bit line with a redundant bit line,
- wherein each of said first amplifier circuits amplifies a potential difference between a corresponding one of said first normal bit lines and a corresponding one of said second normal bit lines,
- said information hold circuit replacing one of said first normal bit lines with said first redundant bit line but not replacing one of said second normal bit lines corresponding to said one of said first normal bit lines with said second redundant bit line.

8. A semiconductor memory device according to claim 7, wherein said information hold circuit can hold information to replace one of said second normal bit lines with said second redundant bit line but not to replace one of said first normal bit lines corresponding to said one of said second normal bit lines with said first redundant bit line.

9. A semiconductor memory device according to claim 7, wherein said information hold circuit can hold information that one of said first normal bit lines is to be replaced with said second redundant bit line and one of said second normal bit lines with said first redundant bit line.

10. A semiconductor memory device according to claim 7, wherein said information hold circuit can hold information that one of said first normal bit lines connected to one of said first amplifier circuits and one of said second normal bit lines are to be respectively replaced with said first redundant bit line and said second redundant line.

11. A semiconductor memory device according to claim 7, wherein said information hold circuit can hold information that one of said first normal bit lines connected to one of said first amplifier circuits is to be replaced with said first redundant bit line and one of said second normal bit lines connected to another of said first amplifier circuits is to be replaced with said second redundant bit line.

* * * * *